(12) United States Patent
Kim

(10) Patent No.: US 8,139,415 B2
(45) Date of Patent: Mar. 20, 2012

(54) PHASE-CHANGE MEMORY DEVICE

(75) Inventor: Dong-Keun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 347 days.

(21) Appl. No.: 12/488,637

(22) Filed: Jun. 22, 2009

(65) Prior Publication Data

US 2010/0232216 A1 Sep. 16, 2010

(30) Foreign Application Priority Data

Mar. 16, 2009 (KR) ........................ 10-2009-0022147

(51) Int. Cl.
*G11C 16/04* (2006.01)
(52) U.S. Cl. ......... 365/185.13; 365/185.05; 365/185.07; 365/185.14
(58) Field of Classification Search .............. 365/185.13, 365/185.05, 185.07, 185.14
See application file for complete search history.

(56) References Cited

U.S. PATENT DOCUMENTS

| | | | |
|---|---|---|---|
| 5,896,340 A * | 4/1999 | Wong et al. ............... | 365/230.03 |
| 6,351,413 B1 * | 2/2002 | Micheloni et al. ........ | 365/185.11 |
| 7,447,070 B2 | 11/2008 | Cernea | |
| 7,490,192 B2 | 2/2009 | Sugimoto et al. | |
| 7,505,348 B2 * | 3/2009 | De Brosse et al. ............ | 365/214 |
| 7,577,032 B2 * | 8/2009 | Umezawa ................ | 365/185.13 |
| 7,643,335 B2 * | 1/2010 | Cho et al. ....................... | 365/163 |
| 2008/0170433 A1 | 7/2008 | Yamada | |
| 2008/0239829 A1 | 10/2008 | Banks | |
| 2008/0298126 A1 | 12/2008 | Ohta et al. | |

FOREIGN PATENT DOCUMENTS

| | | |
|---|---|---|
| JP | 2008-299918 | 12/2008 |
| KR | 100597636 | 7/2006 |
| KR | 1020090010601 | 1/2009 |

OTHER PUBLICATIONS

Notice of Allowance issued from Korean Intellectual Property Office on Oct. 28, 2010.

* cited by examiner

*Primary Examiner* — Pho M Luu
(74) *Attorney, Agent, or Firm* — IP & T Group LLP

(57) ABSTRACT

A phase-change memory device is capable of reducing current consumption and preventing performance deterioration caused due to line load by improving a process of selecting memory cells for a write/read operation. The phase-change memory device has a plurality of cell matrixes and includes word line decoding units that are each shared by a plurality of cell matrixes arranged in a row direction and are configured to activate one of global row signals according to a first row address, local row switch units that are provided to the respective cell matrixes and are configured to connect local current lines to corresponding word lines in response to the activated global row signal, bus connecting units that are provided to the respective cell matrixes and are configured to connect the local current lines to global current lines, and enabling units configured to activate one of the global current lines according to a second row address.

8 Claims, 5 Drawing Sheets

PHASE-CHANGE MEMORY DEVICE

CROSS-REFERENCE TO RELATED APPLICATIONS

The present application claims priority of Korean patent application number 10-2009-0022147, filed on Mar. 16, 2009, the disclosure of which is incorporated by reference herein in its entirety.

BACKGROUND OF THE INVENTION

The present invention relates to a phase-change memory device, and more particularly, to a technology for reducing current consumption occurring in the process of selecting memory cells according to address, and performance deterioration caused due to line load.

Among various memory devices, a dynamic random access memory (DRAM), used as a computer main memory device, is capable of random access and high integration at a low cost. However, the DRAM has a drawback of being a volatile memory. Meanwhile, a NAND flash memory, which is a nonvolatile memory, is capable of high integration at a low cost and is advantageous in terms of power consumption. However, the NAND flash memory has a low operating speed since it is incapable of random access.

A phase-change random access memory (PCRAM) device is an example of various memory devices that have been developed to overcome the drawbacks of such conventional memory devices. The PCRAM device is capable of random access and high integration at a low cost as a nonvolatile memory. That is, the PCRAM device processes data as fast as volatile memories and retains data even in a power-off state.

The PCRAM device stores data using a phase changeable material. The PCRAM device is a nonvolatile memory device that uses a phase change of a phase changeable material depending on the temperature conditions, where a resistance changes proportional to the phase change.

FIG. 1 is a circuit diagram illustrating a structure of a conventional phase-change memory cell.

The phase-change memory cell includes a diode D and a variable resistor R which are connected to a word line WL and a bit line BL, respectively. It is controlled by control signals transferred through the word line WL and the bit line BL.

To write/read data to/from the phase-change memory cell, a control signal activated to a logic low level is transferred through the word line to the phase-change memory cell. Since a potential level of the word line WL becomes low, the phase-change memory cell has current flow from the bit line BL to the word line WL through the diode D.

In a write operation, current, the amount of which depends on the logic level of data to be written, is provided through the bit line by a write driver. (A typical write driver is well known to those skilled in the art and thus, detailed description thereof is omitted.) Accordingly, the resistance of the variable resistor R is determined according to the logic level of data. In a read operation, current, which flows from the bit line BL to the word line WL, is sensed by a bit line sense amplifier. (A typical bit line sense amplifier is well known to those skilled in the art and detailed description thereof is omitted.) Since the resistance of the variable resistor R has a different value according to the logic level of data stored in the phase-change memory cell, the stored data can be distinguished between logic low/high data by sensing the current.

FIG. 2 is a block diagram of a conventional phase-change memory device to illustrate a process of selecting a word line and a bit line according to address.

Hereinafter, it is assumed that 512 word lines and 512 bit lines are allocated per cell matrix MAT and 64 cell matrixes MAT (8 rows*8 columns) exist.

First of all, a row operation to select a corresponding word line is described. Among eight row selection signals XBLK<0:7>, corresponding one, e.g., a first row selection signal XBLK<0> is activated by decoding a first row address XADD<0:2> by a row block selecting unit 210. In response to the activated first row selection signal XBLK<0>, a first word line decoding unit 220_0 is enabled while other word line decoding units 220_1 to 220_7 (omitted in drawings as being the same as the first word line decoding unit) are disabled.

The enabled first word line decoding unit 220_0 receives and decodes a second row address XADD<3:8> to activate one of 64 global row signals GX. The 64 global row signals GX are inputted to local row switch units 230_0 to 230_7 (some omitted in drawings as being the same as the other ones) each provided with 512 word lines WL. Accordingly, the global row signals GX are each allocated eight word lines WL.

When one of the global row signals GX is activated, corresponding eight word lines WL are connected to eight current lines CL while 504 other word lines WL are not connected to the eight current lines CL in each cell matrix MAT. The eight current lines CL are coupled to enabling units 240_0 to 240_7 (some omitted in drawings as being the same as the other ones). The enabling units 240_0 to 240_7 select one of the eight current lines CL belonging thereto in response to a third row address XADD<9:11> and ground the selected current line CL. Accordingly, a potential level of one word line WL is activated to a logic low level in each cell matrixes MAT.

Explaining a column operation to select a corresponding bit line, corresponding one of eight column selection signals YBLK<0:7>, e.g., a first column selection signal YBLK<0> is activated by decoding a first column address YADD<0:2> by a column selecting unit 250. In response to the activated first column selection signal YBLK<0>, a first SA (sense amplifier)/WD (write driver) array unit 260_0 is enabled while other SA/WD array units 260_1 to 260_7 are disabled. The enabled first SA/WD array unit 260_0 receives and decodes a second column address YADD<3:8> to drive one of 64 global bit lines GBL.

Meanwhile, column pre-decoding units 270_0 to 270_7 (some omitted in drawings as being the same as the other ones) decode a third column address YADD<9:11> to output eight pre-decode signals PDEC<0:7>. Local column switch units 280_0 to 280_7 (some omitted in drawings as being the same as the other ones) connect the global bit lines GBL to corresponding local bit lines BL in response to the pre-decode signals PDEC<0:7>. Among 512 local bit lines BL provided in each cell matrix MAT, 64 local bit lines BL are connected to 64 corresponding global bit lines GBL (1:8 coding) by the local column switch units 280_0 to 280_7.

Actually, since one global bit line GBL in cell matrixes MAT0, 8, 16, 24, 32, 40, 48 and 56 is driven by the first SA/WD array unit 260_0 as described above, one local bit line BL in the corresponding cell matrixes is driven. As a result, eight local bit lines BL are driven at the same time and data is processed in one memory cell since one word line WL is selected in the cell matrix MAT0 according to the row operation described above.

To write/read data to/from phase-change memory cells, a relatively high voltage is used. A plurality of word lines WL and a plurality of bit lines BL are driven to select a phase-change memory cell and write/read data to/from it, as described above. Accordingly, line load is relatively greater than other memory devices in the phase-change memory device, where the line load causes current consumption. Therefore, the technology development is required to prevent excess current consumption and performance deterioration due to line load.

SUMMARY OF THE INVENTION

Embodiments of the present invention are directed to provide a phase-change memory device capable of reducing current consumption and preventing performance deterioration caused due to line load by improving a process of selecting memory cells for a write/read operation In accordance with an aspect of the present invention, there is provided a phase-change memory device having a plurality of cell matrixes, which includes word line decoding units that are each shared by a plurality of cell matrixes arranged in a row direction and are configured to activate one of global row signals according to a first row address, local row switch units that are provided to the respective cell matrixes and are configured to connect local current lines to corresponding word lines in response to the activated global row signal, bus connecting units that are provided to the respective cell matrixes and are configured to connect the local current lines to global current lines, and enabling units configured to activate one of the global current lines according to a second row address.

In accordance with another aspect of the present invention, there is provided a phase-change memory device having a plurality of cell matrixes, which includes sense amplifier/write driver array units that are each shared by two or more cell matrixes arranged in a column direction and are configured to select one of global bit lines according to a first column address, column pre-decoding units that correspond to the sense amplifier/write driver array units and are configured to generate pre-decode signals by decoding a second column address, and local column switch units that are provided to the respective cell matrixes and are configured to selectively connect local bit lines to the selected global bit line according to the pre-decode signals.

In accordance with further aspect of the present invention, there is provided a phase-change memory device having a plurality of cell matrixes, which includes word line decoding units that are each shared by a plurality of cell matrixes arranged in a row direction and are configured to activate one of global row signals according to a first row address, local row switch units that are provided to respective cell matrixes and are configured to connect local current lines to corresponding word lines in response to the activated global row signal, bus connecting units that are provided to the respective cell matrixes and are configured to connect the local current lines to global current lines, enabling units configured to activate one of the global current lines according to a second row address, sense amplifier/write driver array units that are each shared by more than two cell matrixes arranged in a column direction and are configured to select global bit lines according to a first column address, column pre-decoding units that are provided corresponding to the sense amplifier/write driver array units and are configured to generate pre-decode signals by decoding a second column address, and local column switch units that are provided to respective cell matrixes and are configured to selectively connect local bit lines to the selected global bit line according to the pre-decode signals.

The phase-change memory device in accordance with the present invention drives need not operate plural cell matrixes in the process of selecting a word line and a bit line for the read or write operation. The phase-change memory device performs the operation per the selected cell matrix. Accordingly, it is advantage to reduce the current consumption. The phase-change memory device can also prevent performance deterioration caused due to line load since the whole length of activated lines becomes shorten.

DESCRIPTION OF SPECIFIC EMBODIMENTS

Other objects and advantages of the present invention can be understood by the following description, and become apparent with reference to the embodiments of the present invention.

Figure 3:
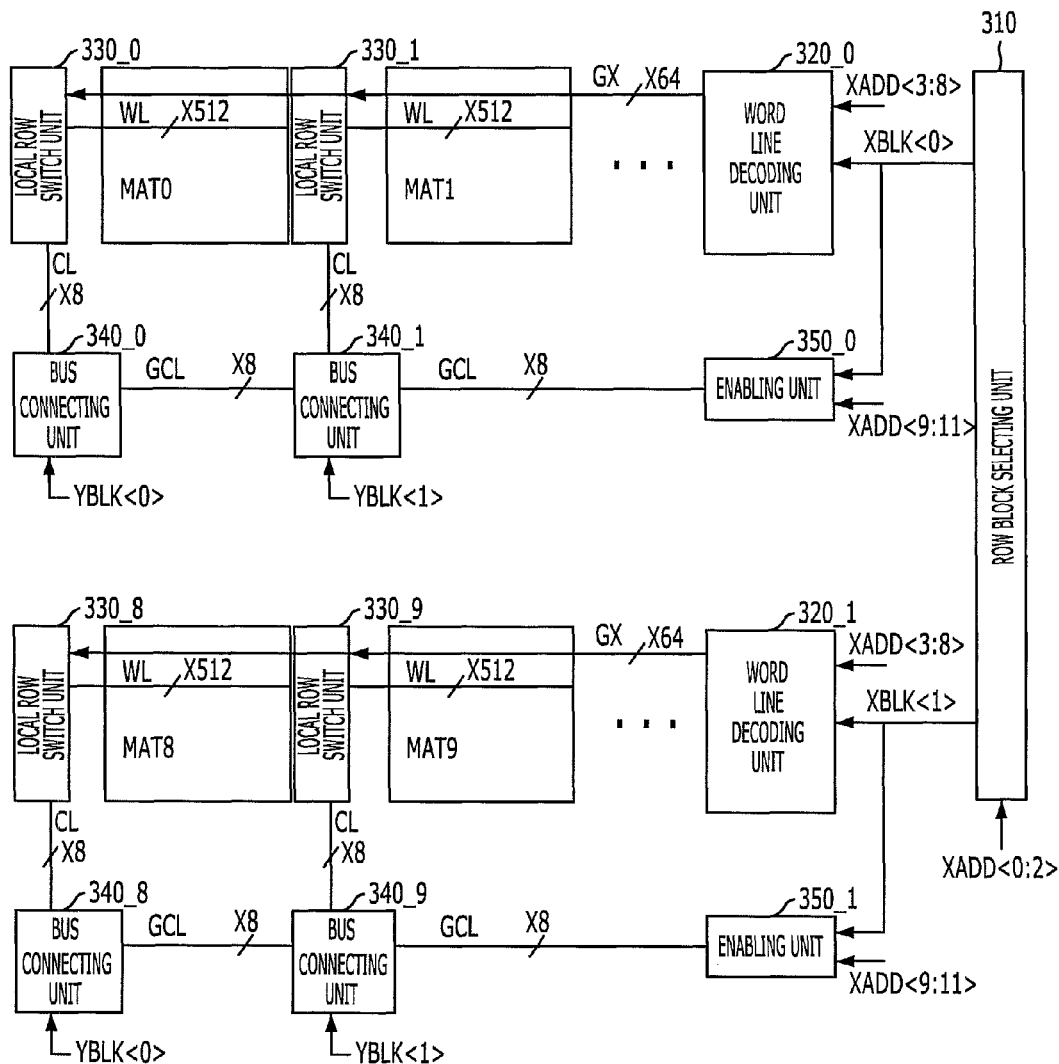
FIG. 3 is a block diagram illustrating a phase-change memory device in accordance with an embodiment of the present invention.

FIG. 3 is a block diagram illustrating a phase-change memory device in accordance with an embodiment of the present invention, which is relevant to a row operation.

Hereinafter, it is assumed that 512 word lines and 512 bit lines are allocated per cell matrix MAT and 64 cell matrixes MAT (8 rows*8 columns) exist. As described above, same elements in drawings are omitted as being redundant.

The phase-change memory device in accordance with the present invention includes word line decoding units 320_0 to 320_7, local row switch units 330_0 to 330_63, bus connecting unit 340-0 to 340-63, enabling units 350-0 to 350-7, and the cell matrixes MAT0 to MAT63.

The word line decoding units 320_0 to 320_7, each shared by two or more cell matrixes arranged in the row direction, activate global row signals GX according to a second row address XADD<3:8>. The local row switch units 330_0 to 330_63, provided to respective cell matrixes MAT0 to MAT63, connect local current lines CL to corresponding word lines WL in response to an activated global row signal GX. The bus connecting units 340-0 to 340-63, provided to respective cell matrixes MAT0 to MAT63, connect the local current lines CL to global current lines GCL. The enabling units 350-0 to 350-7 activate one of the global current lines GCL according to a third row address XADD<9:11>.

A row block selecting unit 310 is further included to activate one of eight row selection signals XBLK<0:7>, e.g., a first row selection signal XBLK<0>, by decoding a first row address XADD<0:2>. In response to the activated first row selection signal XBLK<0>, a first word line decoding unit 320_0 and a first enabling unit 350_0 are enabled in a first row block. The first row block represents a block including cell matrixes MAT0 to MAT7 first arranged in the row direction. Row selection signals corresponding to other row blocks except for the first row selection signal XBLK<0> are disabled.

The enabled first word line decoding unit 320_0 decodes the second row address XADD<3:8> to activate one of 64 global row signals GX. The other word line decoding units 320_1 to 320_7 that are disabled does not perform the decoding operation of the second row address XADD<3:8> and the activation operation of the corresponding global row signal GX.

In response to the global row signal GX activated by the first word line decoding unit 320_0, the local row switch units 330_0 to 330_7 connect corresponding eight word lines WL to the local current lines CL. Since each of the local row switch units 330_0 to 330_7 is provided with 512 word lines WL, the global row signals GX are each allocated eight word lines WL. Accordingly, when one of 64 global row signals GX is activated, the eight word lines WL corresponding to the activated one are connected to the local current lines CL in each of the local row switch units 330_0 to 330_7.

The bus connecting units 340_0 to 340_7 connect the local current lines CL to global current lines GCL. The bus connecting units 340_0 to 340_7 are enabled in response to column selection signals YBLK<0:7>. The column selection signals YBLK<0:7> are for enabling column blocks, which will be described in detail in connection with a column operation. The column blocks each represents a block including cell matrixes arranged in a line in the column direction. Accordingly, assuming that a first column selection signals YBLK<0> is activated, a first bus connecting unit 340_0 is enabled to connect its local current lines CL corresponding to a cell matrix MAT0 to the global current lines GCL. The other bus connecting units 340_1 to 340_7 are disabled, and their local current lines CL are not connected to the global lines GCL.

The local row switch units 330_0 to 330_7 may be also enabled in response to the column selection signals YBLK<0:7>, even though its details are not shown in drawings as being redundant or unnecessary. That is, the local row switch units 330_0 to 330_7 as well as the bus connecting units 340_0 to 340_7 can be enabled according to the column selection of the cell matrixes that they belong to.

The first enabling unit 350_0, enabled by the activated first row selection signal XBLK<0> as described above, decodes the third row address XADD<9:11> to ground one of the global lines GCL. As a result, only one word line WL of the cell matrix MAT0, which belongs to the first row block selected by the first row selection signal XBLK<0> and the first column block selected by the first column selection signal YBLK<0>, is activated to be low logic level. That is, the row and column blocks are selected in response to the row and column selection signals, and only one word line of the cell matrix belonging to them can be activated.

Figure 4:
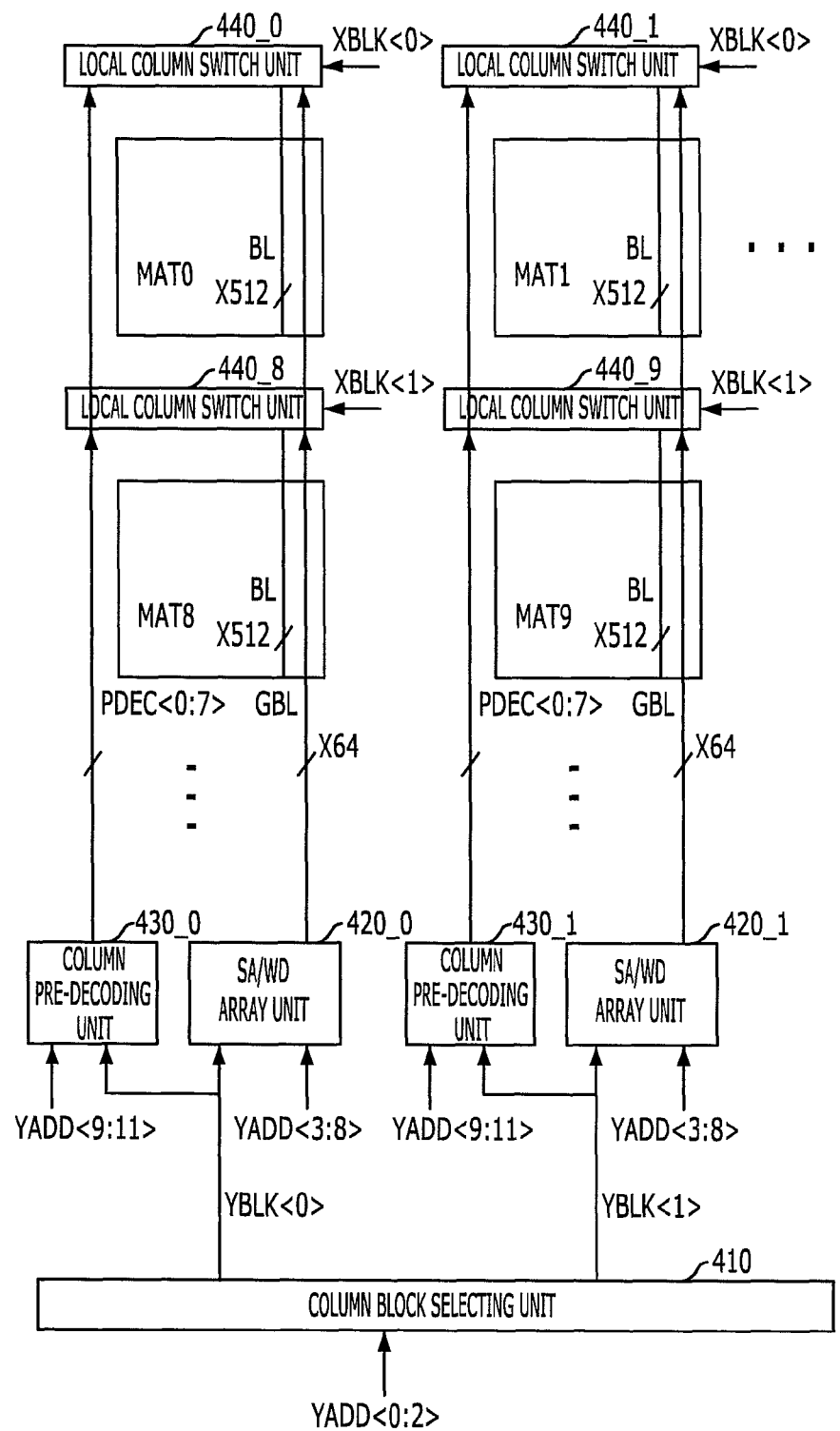
FIG. 4 is a block diagram illustrating a phase-change memory device in accordance with another embodiment of the present invention.

FIG. 4 is a block diagram illustrating a phase-change memory device in accordance with an embodiment of the present invention, which is relevant to a column operation.

Hereinafter, it is assumed that 512 word lines and 512 bit lines are allocated per cell matrix MAT and 64 cell matrixes MAT (8 rows*8 columns) exist.

The phase-change memory device in accordance with the present invention includes SA (sense amplifier)/WD (write driver) array units 420_0 to 420_7, column pre-decoding units 430_0 to 430_7, local column switch units 440_0 to 440-63, and the cell matrixes MAT0 to MAT63.

The SA/WD array units 420_0 to 420_7, each shared by two or more cell matrixes arranged in the column direction, select global bit lines GBL according to a second column address YADD<3:8>. The column pre-decoding units 430_0 to 430_7, provided corresponding to the SA/WD array units 420_0 to 420_7, decode a third column address YADD<9:11> to output pre-decode signals PDEC<0:7>. The local column switch units 440_0 to 440_63, provided to respective cell matrixes MAT0 to MAT63, select local bit lines BL according to pre-decode signals PDEC<0:7> and connect the selected one to the selected global bit line GBL.

A column block selecting unit 410 is further included to activate one of eight column selection signals YBLK<0:7>, e.g., a first row selection signal YBLK<0>, by decoding a first column address YADD<0:2>. In response to the activated first column selection signal YBLK<0>, a first SA/WD array unit 420_0 and a first column pre-decoding unit 430_0 are enabled in a first column block. The first column block represents a block including cell matrixes MAT0, MAT8, MAT16, MAT24, MAT32, MAT40, MAT48, and MAT56 first arranged in the column direction. Column selection signals corresponding to other column blocks except for the first column selection signal YBLK<0> are disabled.

The enabled first SA/WD array unit 420_0 decodes the second column address YADD<3:8> to drive one of the 64 global bit lines GBL. In a write operation, a write driver (WD) drives the global bit lines GBL and a sense amplifier (SA) drives the global bit lines GBL in a read operation. Meanwhile, the other SA/WD array units 420_1 to 420_7 disabled do not perform the decoding operation of the second column address YADD<3:8> and the driving operation of the corresponding global bit line GBL.

The enabled first column pre-decoding unit 430_0 decodes the third column address YADD<9:11> to generate the pre-decode signals PDEC<0:7>. The other column pre-decoding unit 430_1 to 430_7 disabled does not perform the decoding operation of the third column address YADD<9:11> and the generating operation of the corresponding pre-decode signals PDEC<0:7>

In response to the pre-decode signals PDEC<0:7> generated by the first column pre-decoding unit 430_0, the local column switch units 440_0, 440_8, 440_16, 440_24, 440_32, 440_40, 440_48, and 440_56 connect the local bit lines BL to the global bit lines GBL. Among the 512 local bit lines BL provided in each cell matrix MAT, 64 local bit lines BL correspond to one bit of the pre-decode signals PDEC<0:7> (1:8 coding). Accordingly, the local column switch units 440_0, 440_8, 440_16, 440_24, 440_32, 440_40, 440_48, and 440_56 connect the 64 local bit lines BL to the 64 global bit lines GBL in respective cell matrixes MAT08, 16, 24, 32, 40, 48 and 56.

However, in accordance with the present invention, the local column switch units 440_0, 440_8, 440_16, 440_24, 440_32, 440_40, 440_48, and 440_56 are enabled in response to the row selection signal XBLK<0:7>. One of them operates in response to the pre-decode signals PDEC<0:7>. In addition, one local bit line BL in the operating local column switch unit is actually driven, since one global bit line GBL is driven by the first SA/WD array unit 420_0 as described above.

Assuming that the first row selection signal XBLK<0> is activated, only the local column switch unit 440_0 operates. One local bit line BL in the cell matrix MAT0 is actually driven by the first SA/WD array unit 420_0. As a result, only one local bit line BL of the cell matrix MAT0, which belongs to the first row block selected by the first row selection signal XBLK<0> and the first column block selected by the first column selection signal YBLK<0>, is activated to low logic level. That is, the row and column blocks are selected in response to the row and column selection signals, and only one local bit line of the cell matrix belonging to them can be activated.

Figure 5:
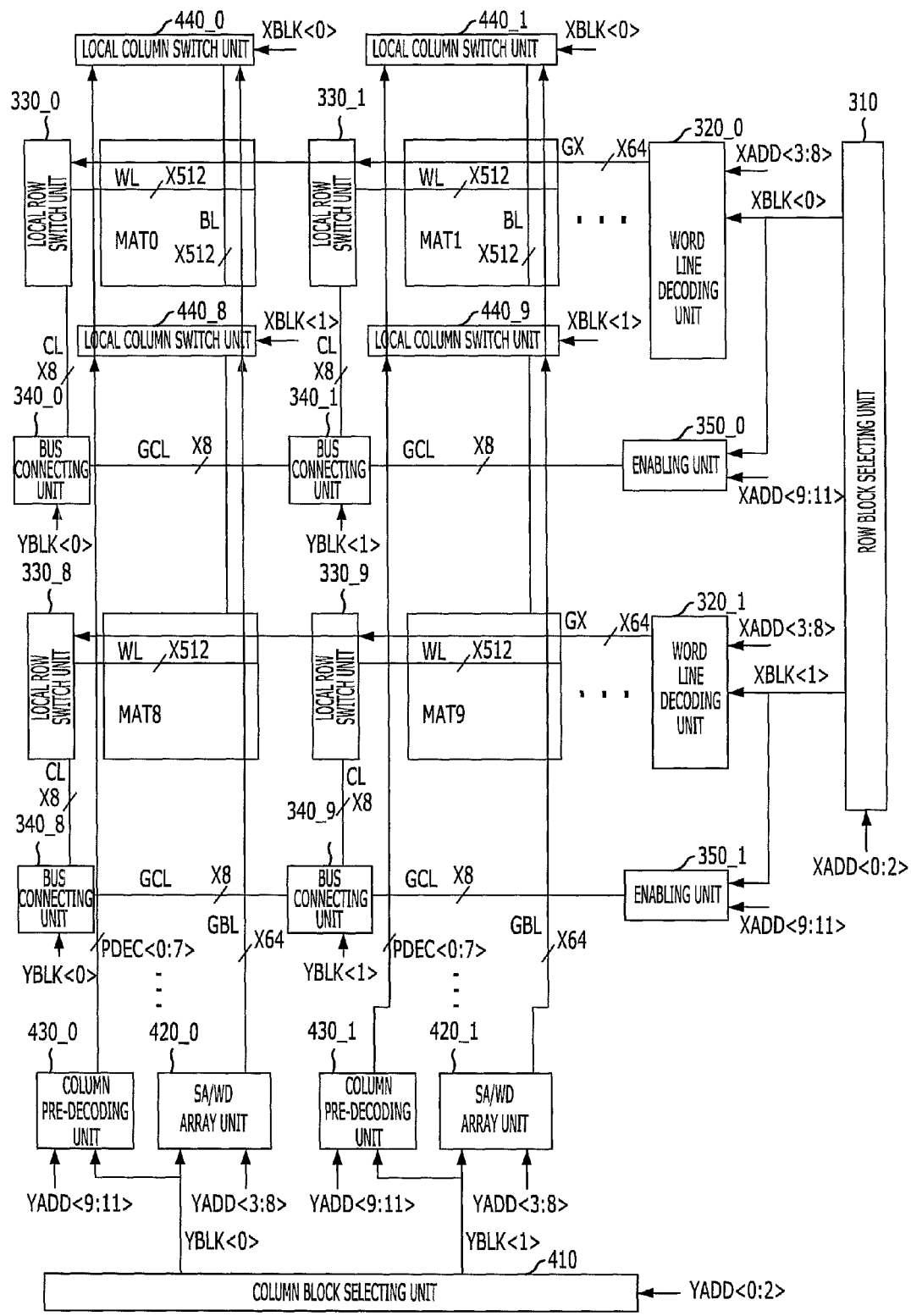
FIG. 5 is a block diagram illustrating a phase-change memory device in accordance with still another embodiment of the present invention.

FIG. 5 is a block diagram illustrating a phase-change memory device in accordance with an embodiment of the present invention, which is relevant to row and column operations.

In accordance with the phase-change memory device of the present invention, a word line WL or a local bit line BL can be activated only in the cell matrix actually selected without activating word lines or bit lines in other cell matrixes.

Figure 1:
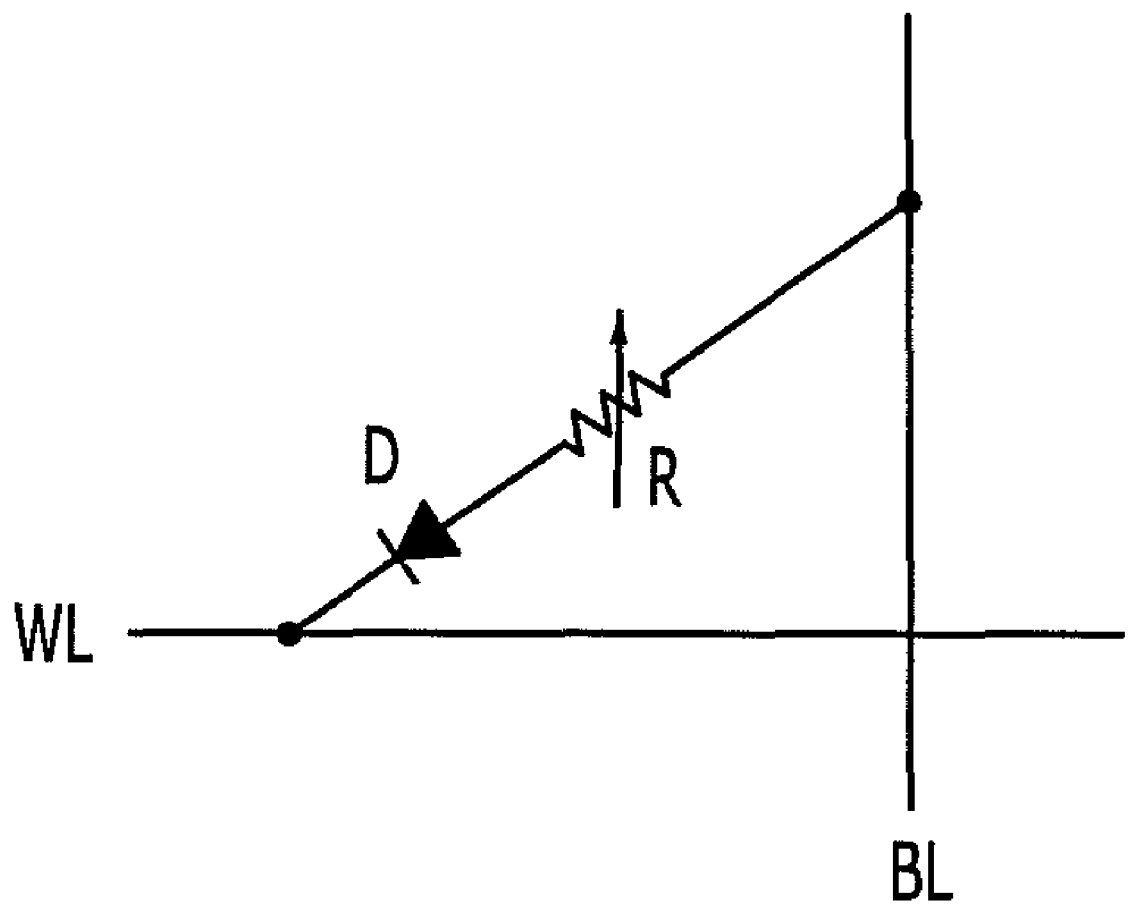
FIG. 1 is a circuit diagram illustrating a structure of a conventional phase-change memory cell.
Figure 2:
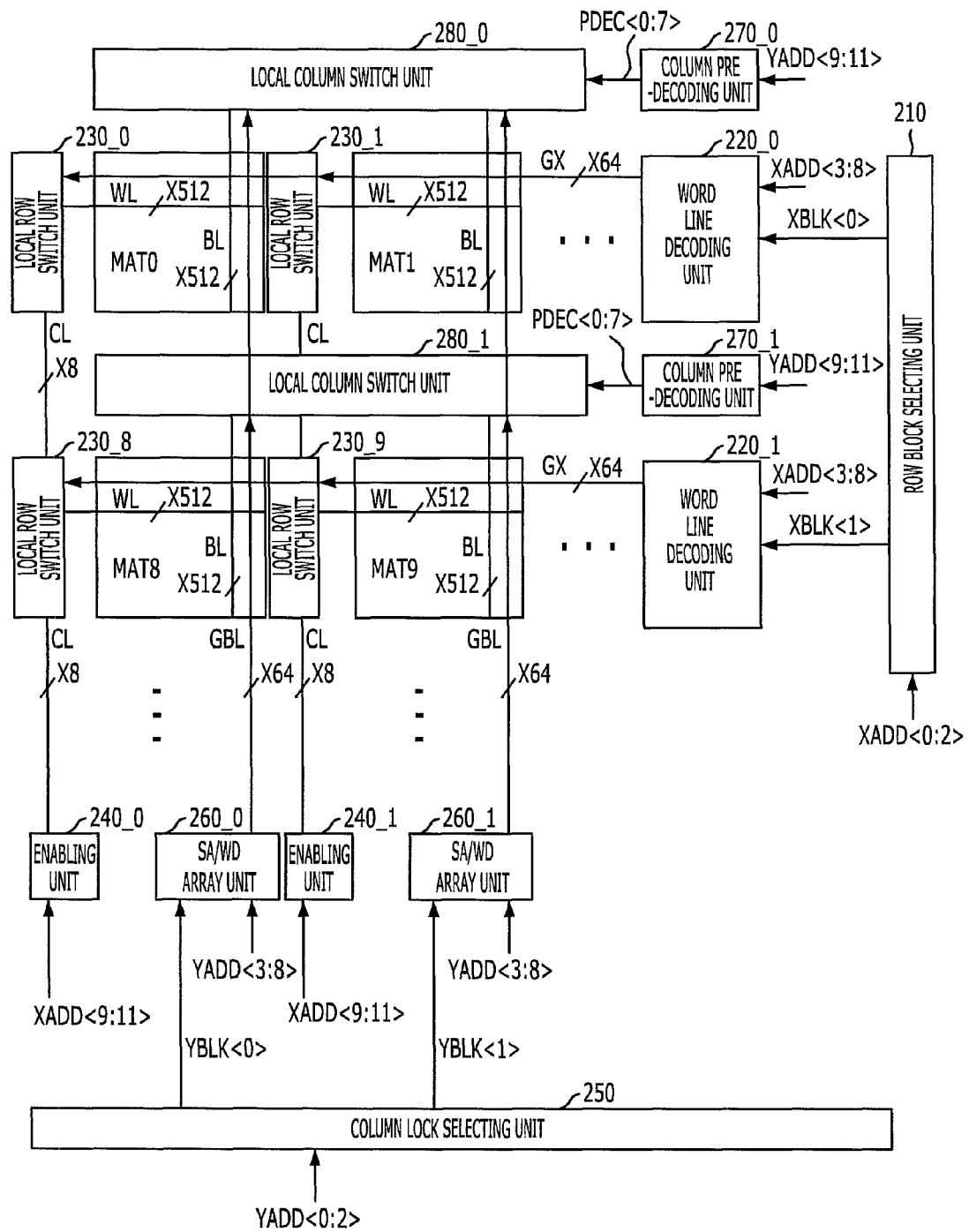
FIG. 2 is a block diagram of a conventional phase-change memory device.

For example, the upper row block is selected by the first row address XADD<0:2> and the left column block is selected by the first column address YADD<0:2>. At this point, one word line WL and one local bit line BL are activated only in the cell matrix MAT0 in accordance with the phase-change memory device of the present invention. On the contrary, referring to FIG. 2, a word line WL is activated in the cell matrixes MAT0 to MAT7 and a local bit line BL is activated in the cell matrixes MAT0, MAT8, MAT16, MAT24, MAT32, MAT40, MAT48, and MAT56 in the conventional phase-change memory device.

As described above, the phase-change memory device in accordance with the present invention drives only the word line and the local bit line in the cell matrix actually selected. It can reduce the current consumption occurring in a process of selecting a memory cell. In addition, there is no need to activate plural lines at the same time for the process of data in accordance with the present invention. It also prevents the increase of line load caused when activating plural lines at the same time.

While the present invention has been described with respect to the specific embodiments, it will be apparent to those skilled in the art that various changes and modifications may be made without departing from the spirit and scope of the invention as defined in the following claims.

What is claimed is:

1. A phase-change memory device having a plurality of cell matrixes, comprising:
   sense amplifier/write driver array units that are each shared by two or more cell matrixes arranged in a column direction and are configured to select one of global bit lines according to a first column address;
   column pre-decoding units that correspond to the sense amplifier/write driver array units and are configured to generate pre-decode signals by decoding a second column address; and
   local column switch units that are provided to the respective cell matrixes and are configured to selectively connect local bit lines to the selected global bit line according to the pre-decode signals.

2. The phase-change memory device of claim 1, wherein each of the sense amplifier/write driver array units and each of the column pre-decoding units are enabled when a column direction of the corresponding cell matrix is selected.

3. The phase-change memory device of claim 1, wherein each of the local column switch units are enabled when a row direction of the corresponding cell matrix is selected.

4. The phase-change memory device of claim 1, further comprising a column block selecting unit configured to activate column selection signals for selecting column blocks according to a third column address, wherein each column block corresponds cell matrixes arranged in a line in a column direction.

5. A phase-change memory device having a plurality of cell matrixes, comprising:
   word line decoding units that are each shared by a plurality of cell matrixes arranged in a row direction and are configured to activate one of global row signals according to a first row address;
   local row switch units that are provided to respective cell matrixes and are configured to connect local current lines to corresponding word lines in response to the activated global row signal;
   bus connecting units that are provided to the respective cell matrixes and are configured to connect the local current lines to global current lines;
   enabling units configured to activate one of the global current lines according to a second row address;
   sense amplifier/write driver array units that are each shared by more than two cell matrixes arranged in a column direction and are configured to select global bit lines according to a first column address;
   column pre-decoding units that are provided corresponding to the sense amplifier/write driver array units and are configured to generate pre-decode signals by decoding a second column address; and
   local column switch units that are provided to respective cell matrixes and are configured to selectively connect local bit lines to the selected global bit line according to the pre-decode signals.

6. The phase-change memory device of claim 5, further comprising:
   a row block selecting unit configured to activate row selection signals for selecting row blocks according to a third row address, wherein each row block corresponds cell matrixes arranged in a line in a row direction; and
   a column block selecting unit configured to activate column selection signals for selecting column blocks according to a third column address, wherein each column block corresponds cell matrixes arranged in a line in a column direction.

7. The phase-change memory device of claim 6, wherein the word line decoding units, the enabling units, and the local column switch units are enabled in response to the row selection signals.

8. The phase-change memory device of claim 5, wherein the local row switch units, the bus connecting units, the sense amplifier/write driver array units, and the column pre-decoding units are enabled in response to the column selection signals.

* * * * *